(12) United States Patent
Innocent et al.

(10) Patent No.: US 10,692,179 B2
(45) Date of Patent: Jun. 23, 2020

(54) METHODS AND APPARATUS FOR SIGNAL DISTRIBUTION IN AN IMAGE SENSOR

(71) Applicant: SEMICONDUCTOR COMPONENTS INDUSTRIES, LLC, Phoenix, AZ (US)

(72) Inventors: Manuel H. Innocent, Wezemaal (BE); Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/815,949

(22) Filed: Nov. 17, 2017

(65) Prior Publication Data

US 2019/0156458 A1 May 23, 2019

(51) Int. Cl.
| G11C 7/00 | (2006.01) |
| G06T 3/40 | (2006.01) |
| G06T 1/20 | (2006.01) |
| G11C 7/22 | (2006.01) |
| H04N 5/335 | (2011.01) |
| H04N 5/369 | (2011.01) |
| H04N 5/376 | (2011.01) |

(52) U.S. Cl.
CPC .............. G06T 3/4023 (2013.01); G06T 1/20 (2013.01); G11C 7/222 (2013.01); H04N 5/335 (2013.01); H04N 5/379 (2018.08); H04N 5/3765 (2013.01)

(58) Field of Classification Search
CPC .......... G06T 3/4023; G06T 1/20; G11C 7/222
USPC ....................................................... 365/194
See application file for complete search history.

(56) References Cited

U.S. PATENT DOCUMENTS

| 6,809,769 B1* | 10/2004 | Yang | H01L 27/14601 348/308 |
| 8,582,011 B2* | 11/2013 | Dosluoglu | H04N 5/353 348/296 |
| 8,946,610 B2* | 2/2015 | Iwabuchi | H01L 23/481 250/208.1 |
| 2005/0195304 A1* | 9/2005 | Nitta | H03M 1/1023 348/308 |

(Continued)

OTHER PUBLICATIONS

Shan-Fu Yeh et al., A 3 Megapixel 100 Fps 2.8um Pixel Pitch CMOS Image Sensor Layer with Built-in Self-Test for 3D Integrated Images, IEEE Journal of Solid-State Circuits, Mar. 2013, pp. 839-849, vol. 48, No. 3, IEEE, US.

(Continued)

Primary Examiner — Tha-O H Bui
(74) Attorney, Agent, or Firm — The Noblitt Group, PLLC; Hettie L. Haines

(57) ABSTRACT

Various embodiments of the present technology provide a method and apparatus for signal distribution in an image sensor. In various embodiments, the apparatus provides a balanced signal distribution circuit having a plurality of driver circuits, wherein each driver circuit is connected to a logic circuit, distributed either directly below the pixel array or interspersed within the pixel array. A clock distribution network is connected to the logic circuit to provide all the logic circuits with a clock signal substantially simultaneously, which, in turn, controls all of the driver circuits substantially simultaneously and all pixels in the pixel array receive a control signal substantially simultaneously.

20 Claims, 6 Drawing Sheets

(56) References Cited

U.S. PATENT DOCUMENTS

2012/0307030 A1* 12/2012 Blanquart ......... H01L 27/14601
348/76
2015/0146063 A1* 5/2015 Nishizawa ............ H04N 5/378
348/302

OTHER PUBLICATIONS

Adi Xhakoni et al., A Low-Noise High-Frame-Rate 1-D Decoding Readout Architecture for Stacked Image Sensors, IEEE Sensors Journal, Jun. 2014, pp. 1966-1973, vol. 14, No. 6, IEEE, US.
Tomohiro Takahashi et al., A 4.1Mpix 280fps Stacked CMOS Image Sensor with Array-Parallel ADC Architecture for Region Control, Symposium on VLSI Circuits Digest of Technical Papers, Jun. 8, 2017, pp. C244-C245, Japan Society of Applied Physics, Japan.

* cited by examiner

METHODS AND APPARATUS FOR SIGNAL DISTRIBUTION IN AN IMAGE SENSOR

BACKGROUND OF THE TECHNOLOGY

Various devices within an integrated circuit are electrically connected to each other and other areas of the chip with metal wiring (interconnects) to transmit signals from one area of the chip to another. The electrical interconnects, however, introduce signal "time-delays," which are dominated by resistive-capacitive effects (i.e., RC delay). Accordingly, the operation and speed of the integrated circuit may be hindered by the signal delay of the wire and/or other circuits.

Figure 1:
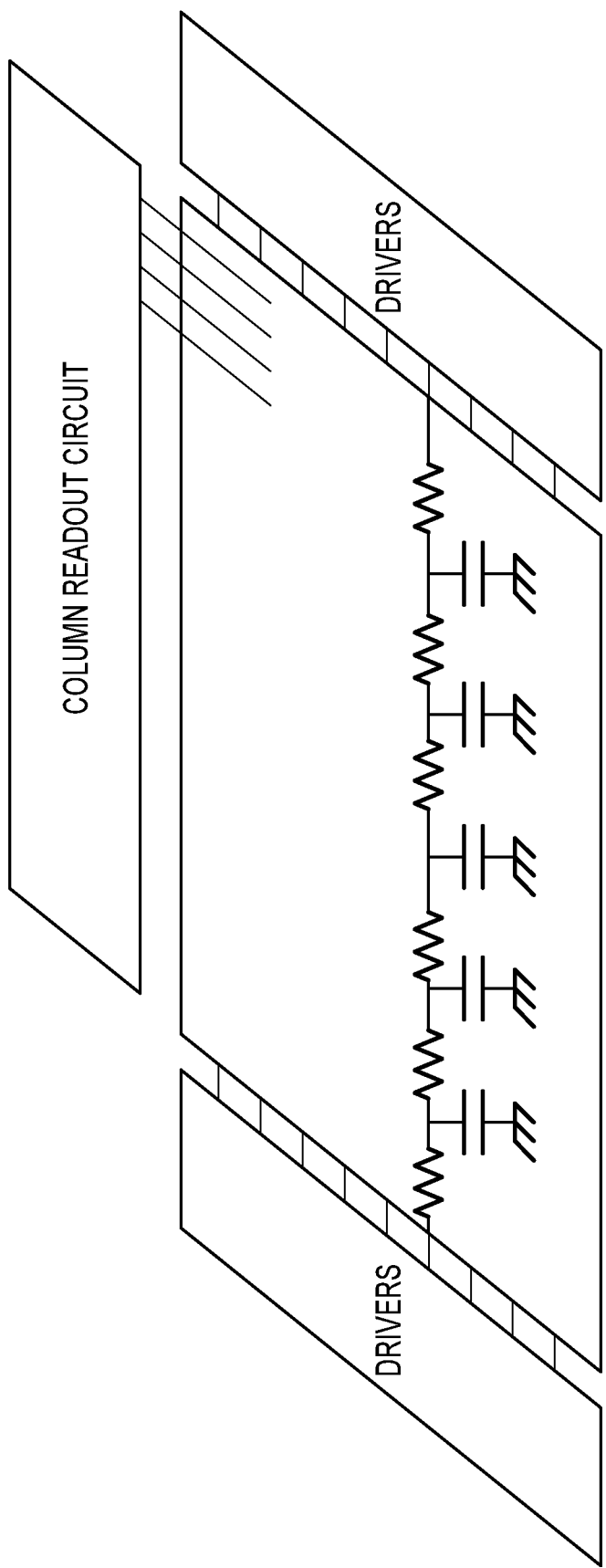

In an image sensor, driver circuits are utilized to facilitate transmission of control signals to a pixel array. In conventional image sensors, the driver circuits are positioned in a region lateral to the pixel array, for example as illustrated in FIG. 1. The control signals are transmitted to the edge of the pixel array and then across the pixel array to each pixel. Due to the large area of the pixel array combined with the inherent time-delays of the circuit interconnects, the control signals do not reach all areas of the pixel array and/or each pixel at the same time. For example, pixels at and/or near the outer edges of the pixel array will receive the control signal earlier in time than the pixels in and/or near the center of the pixel array. This is especially problematic for an image sensor operation that requires all pixels to integrate at the same time and/or for a short period of time.

SUMMARY OF THE INVENTION

Various embodiments of the present technology comprise a method and apparatus for signal distribution in an image sensor. In various embodiments, the apparatus comprises a balanced signal distribution circuit having a plurality of driver circuits, each driver circuit connected to a logic circuit, distributed either directly below the pixel array or interspersed within the pixel array. A clock distribution network is connected to the logic circuits to provide all the logic circuits with a clock signal substantially simultaneously, which, in turn, controls all of the driver circuits substantially simultaneously and all pixels in the pixel array receive a control signal substantially simultaneously.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
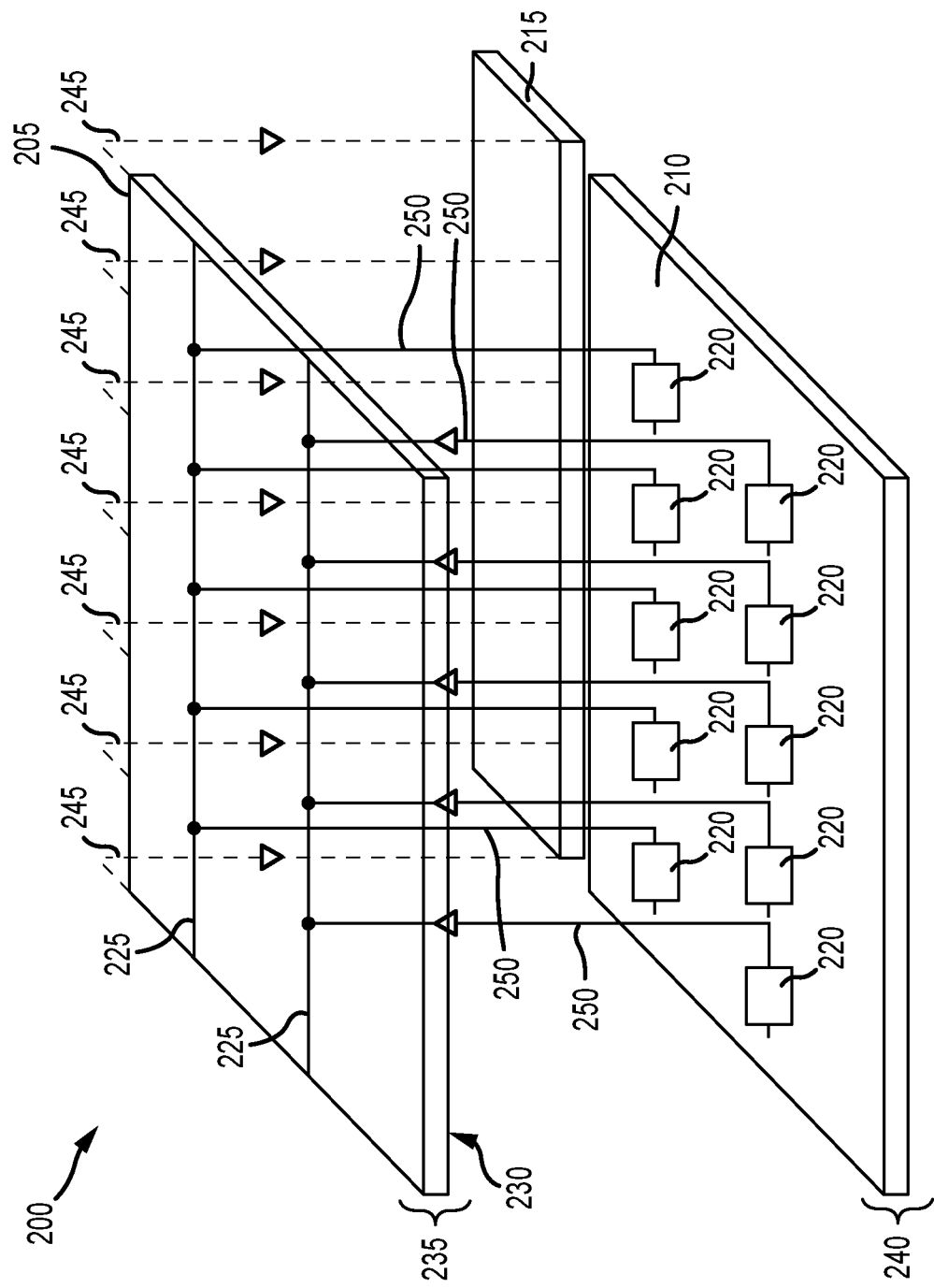
Figure 3:
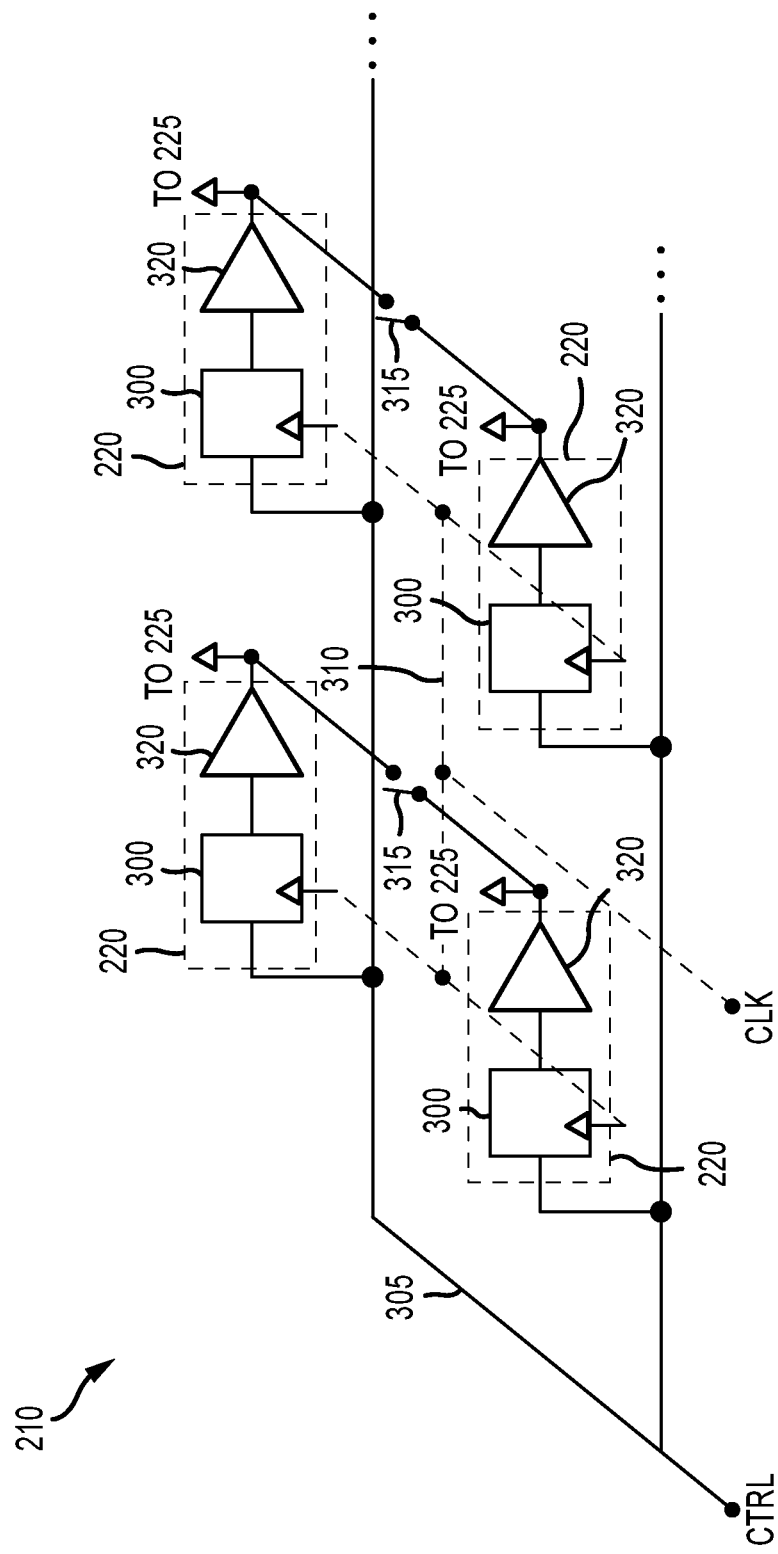
Figure 4:
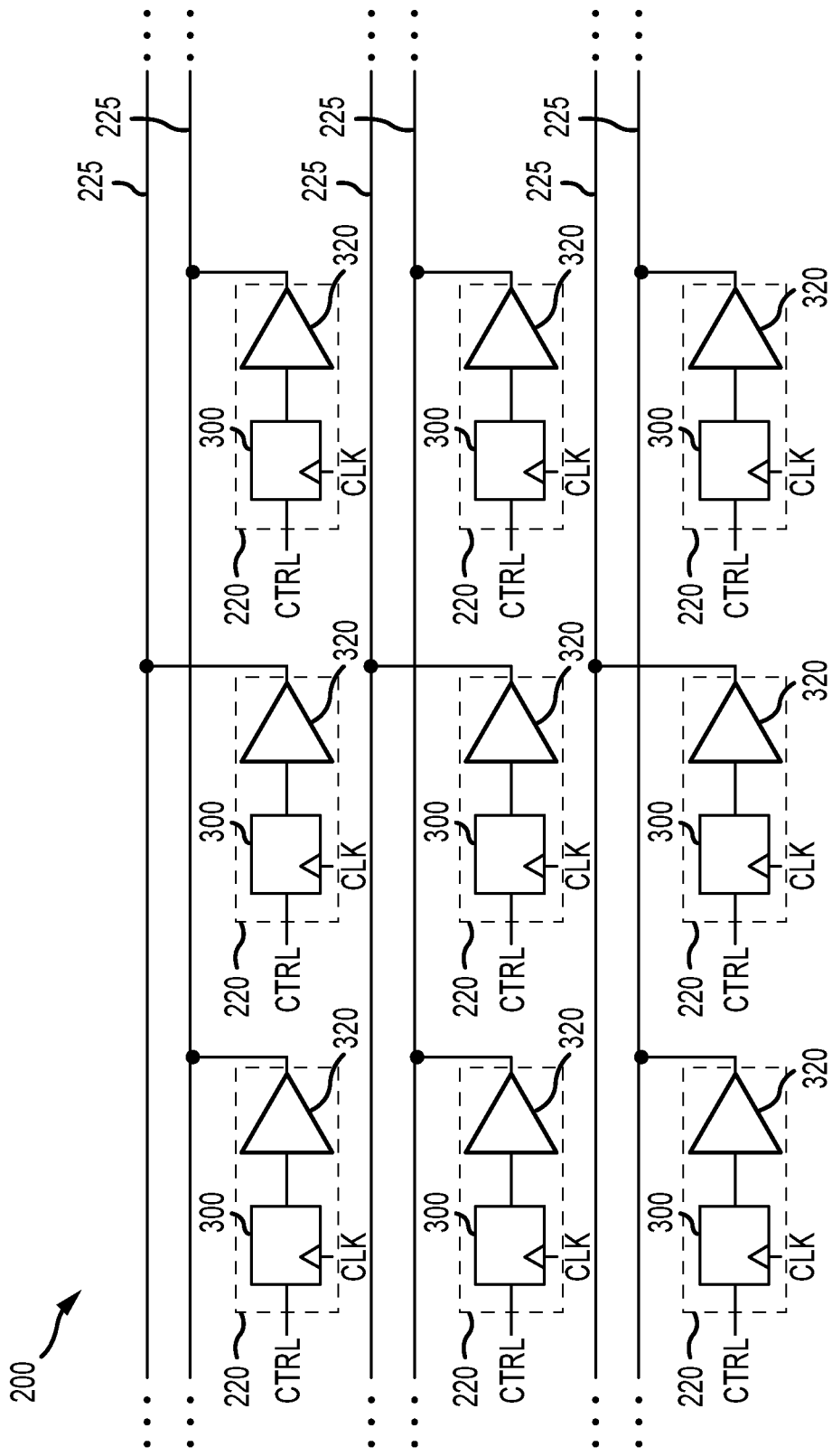
Figure 5:
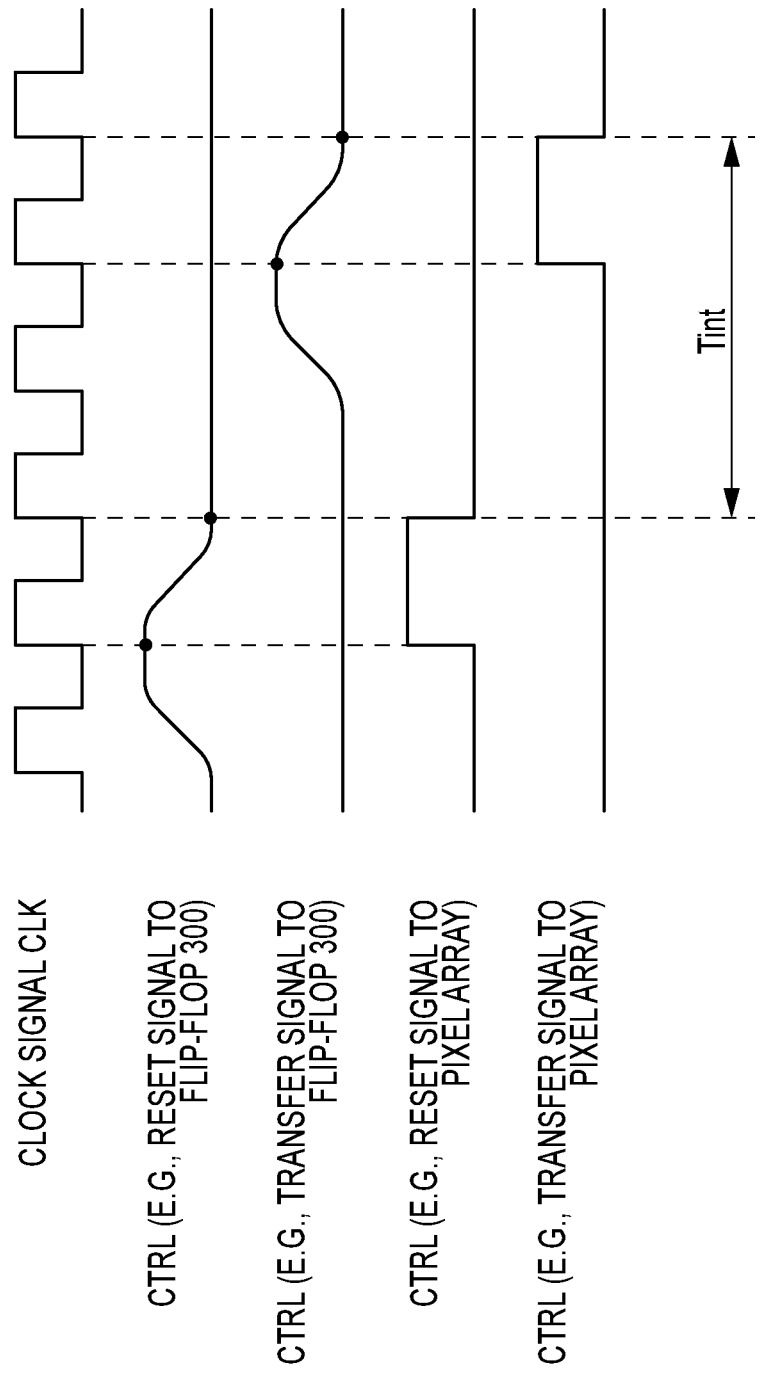
Figure 6:
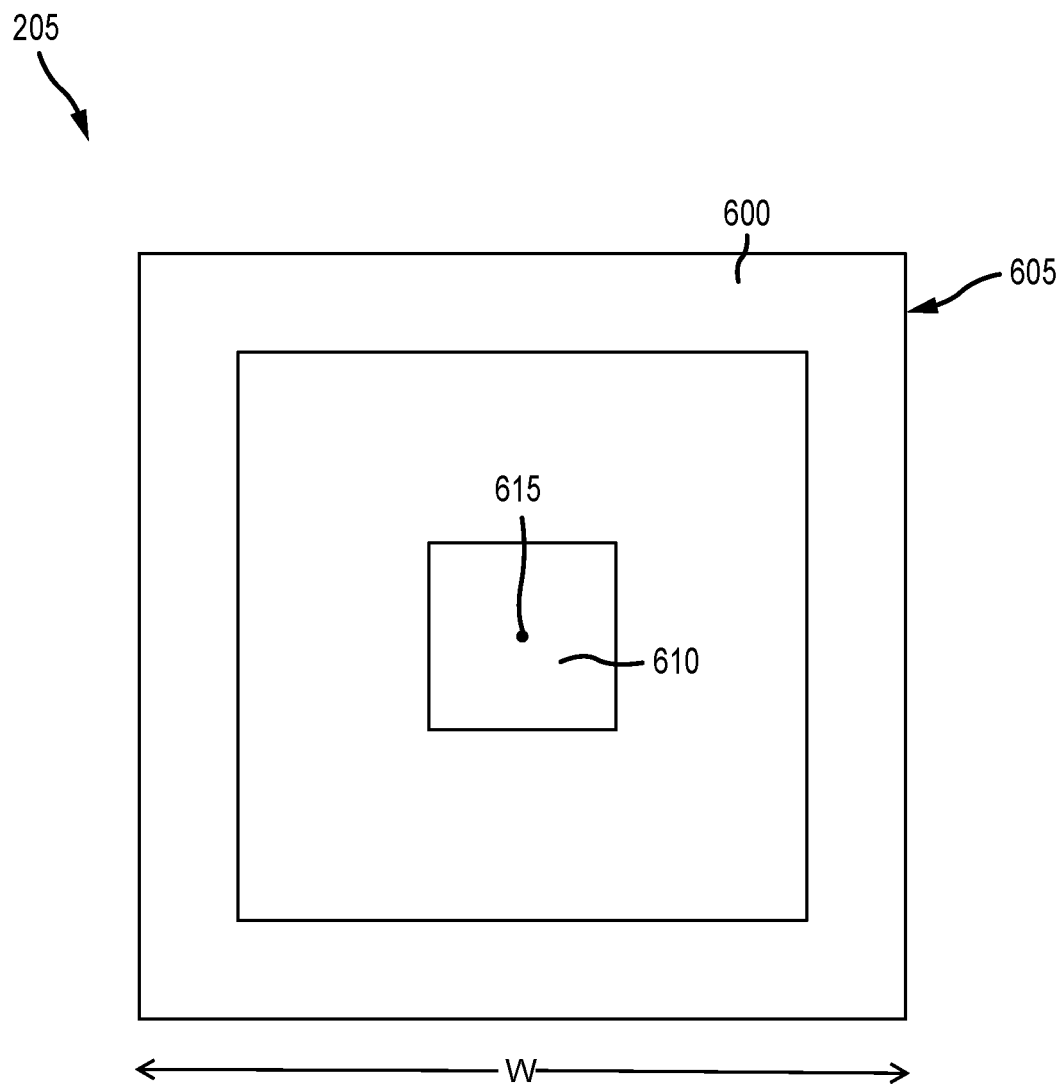

FIG. 1 representatively illustrates a perspective view of a conventional image sensor;

FIG. 2 representatively illustrates a perspective view of an image sensor in accordance with an exemplary embodiment of the present technology;

FIG. 3 representatively illustrates a perspective view of a portion of a balanced signal distribution circuit in accordance with an exemplary embodiment of the present technology;

FIG. 4 representatively illustrates a top-down view of a portion of an image sensor in accordance with an exemplary embodiment of the present technology;

FIG. 5 is a timing diagram of a balanced signal distribution circuit in accordance with an exemplary embodiment of the present technology; and FIG. 6 representatively illustrates a pixel array in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various photo sensors, driver circuits, amplifiers, flip-flop circuits, memory devices, logic circuits, processors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for capturing image data, sampling image data, processing image data, generating and transmitting clock signals, generating and transmitting control signals, and the like. In addition, the present technology may be practiced in conjunction with any image sensor operating mode, such as global release mode, global shutter mode, and electronic rolling shutter mode.

Methods and apparatus for signal distribution in an image sensor according to various aspects of the present technology may be incorporated into any suitable electronic system and/or device, such as a digital camera, smartphone, laptop, portable devices, consumer electronics, and the like. Referring to FIGS. 2 and 6, an exemplary image sensor 200 may be suitably configured to capture image data and to provide more accurately-timed pixel control signals CTRL, such as a reset signal, a readout signal, a transfer signal, and the like, by strategically positioning various components relative to other components to reduce or eliminate varying signal time delays. For example, in various embodiments, the image sensor 200 may comprise a pixel array 205, a balanced signal distribution circuit 210, and a readout circuit 215. In various embodiments, the image sensor 200 may further comprise a control unit (not shown) configured to generate the control signal CTRL.

The pixel array 205 detects light and conveys information that constitutes an image by converting the variable attenuation of light waves (as they pass through or reflect off the object) into electrical signals. The pixel array 205 may comprise an outer region 600, which comprises the area adjacent to and/or near an outer edge 605 of the pixel array 205, and a central region 610, which comprises the area at and/or near a center point 615 of the pixel array 205, wherein each region comprises a plurality of pixels (not shown). In various embodiments, the outer region 600 may be defined as 5-50% of the pixel array 205 and the central region 610 may be defined as 5-50% of the pixel array 205. For example, in an exemplary embodiment, the outer region 600 comprises approximately 44% of the pixel array 205 and the central region 610 comprises approximately 6% of the pixel array 205.

The pixels may be arranged in rows and columns, and the pixel array 205 may contain any number of rows and columns, for example, hundreds or thousands of rows and columns. For example, the pixel array 205 may be described as an m-by-n array, where m is the number of rows, n is the number of columns, and the number of totals total pixels is m×n. The location of each individual pixel may be identified by a row number and a column number. Accordingly, the pixels located adjacent to and/or near the outer edge 605 (i.e., within the outer region 600) of the pixel array 205 may be described as "edge pixels" and the pixels located at and/or near the center point 615 (i.e., within the central region 610) of the pixel array 205 may be described as "central pixels."

Each pixel may comprise any suitable photosensor, such as a photogate, a photodiode, and the like, to detect light and convert the detected light into a charge (i.e., a pixel signal). Each pixel may further comprise various control and readout circuitry, such as one or more transistors, a charge storage region, and a floating diffusion region. According to an exemplary embodiment, the pixel array 205 comprising the photosensors may be formed on a first die 235.

In various embodiments, the pixels may be implemented in a stacked-chip arrangement if desired. For example, the pixel may be split at any desired point or points within the pixel (e.g., between a transistor and the floating diffusion region, between the photodiode and a transistor, between the charge storage region and a transistor, between adjacent transistors, etc.).

Each pixel in the pixel array 205 may be electrically connected to a pixel control line 225. The pixel control line 225 may be suitably configured to transmit various control signals to one or more pixels in the pixel array 205. For example, the pixel control line 225 may comprise metal wiring capable of transmitting an electrical signal. In various embodiments, the pixels may be grouped, for example in groups of 2, 4, or any suitable number, such that pixels in a particular group receive the same control signal CTRL via the pixel control line 225. In an exemplary embodiment, the pixel array 205 comprises a plurality of pixel control lines 225, wherein each pixel control line 225 is electrically connected to a subset of pixels of the plurality of pixels.

In various embodiments, the image sensor 200 may comprise a color filter system (not shown), such as a color filter array (CFA), to filter impinging light according to wavelength. The CFA may comprise a pattern of color filters situated on the pixel array 205 to capture color information. In the exemplary embodiment, each pixel is covered with one color of the CFA. For example, a Bayer color filter array comprising a pattern of red, blue, and green filters may be provided, wherein each pixel is covered with one of a red, blue, or green filter. In other embodiments, the CFA may be formed using other color filters, such as a CYYM filter (one cyan, two yellow, and one magenta), a CYGM filter (one cyan, one yellow, one green, and one magenta), a CRGB filter (one cyan, one red, one green, and one blue), and any other suitable color pattern. In various embodiments, the CFA may comprise "clear" or transparent filter elements. The CFA may form a 2×2 color pattern, a 4×4 color pattern, a 2×4 color pattern, or any other suitable pattern size. In various embodiments, the CFA may repeat to cover the entire pixel array 205.

In various embodiments, the image sensor 200 may further comprise a microlens array (not shown) formed by a plurality of microlenses disposed on the pixel array 205 to help focus light on the pixels. The size and type of the microlenses may be selected for a particular application, and may be formed using conventional fabrication techniques and methods.

The image sensor 200 may be implemented in conjunction with any appropriate technology, such as active pixel sensors in complementary metal-oxide-semiconductors (CMOS) and charge-coupled devices.

The readout circuit 215 is configured to facilitate readout operations, such as reading out pixel signals from the pixel array 205. For example, the readout circuit 215 may be electrically connected to the pixel array 205 via a plurality of readout lines 245. In an exemplary embodiment, the plurality of readout lines 245 are arranged along the columns of the pixel array 205 and configured to electrically connect each column of the pixel array 205 to the readout circuit 215 and/or supply a bias signal, such as a bias current or bias voltage.

In various embodiments, the readout circuit 215 may further comprise various components to process the pixel signals. For example, the readout circuit 215 may comprise an amplifier circuit (not shown) to amplify each pixel signal and may apply a desired gain to each pixel signal. In various embodiments, the amplifier circuit may apply a relatively high gain to the pixel signals when the corresponding pixel captures darker portions of a scene, or may apply a relatively low gain when the corresponding pixel captures brighter portions of a scene. The readout circuit 215 may further comprise a sample-and-hold circuit (not shown) for sampling and temporarily storing pixel signals read out from the pixel array 205, an analog-to-digital conversion (ADC) circuit (not shown) to convert the analog pixel signals received from the pixel array 205 into corresponding digital pixel signals, a bias circuit (not shown), a comparator circuit (not shown), memory (not shown), a circuit for selectively enabling or disabling the readout circuit 215 (not shown), and/or other circuits that are coupled to one or more columns of the pixel array 205.

Referring to FIGS. 2-4, the balanced signal distribution circuit 210 may be electrically connected to the pixel array 205 and configured to perform various processing, control, and/or readout operations of the pixels and/or the pixel signals. In various embodiments, the balanced signal distribution circuit 210 is configured to transmit various signals to the pixel array 205 in a manner that ensures that the signals reach each pixel in the pixel array 205 substantially simultaneously. A conventional pixel array having a width W of approximately 3 cm or greater (distance across all rows) will have a signal delay (i.e., time delay) of approximately 250 nanoseconds (ns) to 1 microsecond between pixels in the central region 610 and pixels in the outer region 600. According to a first embodiment of the present technology, the pixel array 205 has a width W of approximately 3 cm or greater and the balanced signal distribution circuit 210 delivers a signal to the pixel array 205 and/or the pixels with a time delay between the central region 610 and the outer region 600 of less than 100 ns, for example in a range of approximately 50 ns to 100 ns. According to a second embodiment of the present technology, the pixel array 205 has a width W of approximately 2 cm to 3 cm and the balanced signal distribution circuit 210 delivers a signal to the pixel array 205 and/or the pixels with a time delay between the central region 610 and the outer region 600 of less than 100 ns, for example in a range of approximately 10 ns to 100 ns. According to various embodiments of the present technology, the layout and/or architecture of the balanced signal distribution circuit 210 in relation to the pixel array 205 and/or pixels facilitates signal distribution such that any RC time delays that are introduced will be applied to all signals substantially equally. Therefore, the pixels located in both the outer region 600 and the central region 610 of the pixel array 205 receive the signals (e.g., clock signal and/or control signal) at substantially the same time, which improves operation of the pixel array 205. For example, in one embodiment, the balanced signal distribution circuit may comprise a balanced tree network, such as an H-tree structure. The balanced signal distribution circuit 210 may comprise any number of devices for performing calculations, transmitting control signals, storing state information, and the like. The balanced signal distribution circuit 210 may further comprise any suitable distribution network, such as metal wiring, for transmitting a control signal, transmitting a clock signal, and the like. For example, the balanced signal distribution circuit 210 may comprise a plurality of control circuits 220, a signal control line 305, and a clock distribution network 310.

According to one embodiment, and referring to FIG. 2, the balanced signal distribution circuit 210 may be formed on a second die 240 positioned adjacent to a major surface 230 of the first die 235, wherein the first and second dies 235, 240 are vertically stacked and are situated in separate planes. The first and second dies 235, 240 may be electrically coupled using any suitable bonding technique and/or electrical interconnects. For example, the first and second dies 235, 240 may be electrically coupled using hybrid bonds, or other similar bonding technology, to create electrically conductive paths 250 from the control circuits 220 to the pixel control lines 225.

According to an alternative embodiment, the balanced signal distribution circuit 210 and the pixel array 205 may be formed on the same die. In the present case, various components of the balanced signal distribution circuit 210, such as the plurality of control circuits 220 and the clock distribution network 310, may be integrated throughout the pixel array 205. For example, the plurality of control circuits 220 may be interspersed between the pixels and electrically coupled via the electrically conductive paths 250 from the control circuits 220 to the pixel control lines 225.

In various embodiments, the electrically conductive paths 250 may connect various regions of the balanced signal distribution circuit 210 directly to various regions of the pixel array 205. For example, the balanced signal distribution circuit 210 may be directly connected to the outer region 600 of the pixel array 205 with one or more conductive paths 250 and may further be directly connected to the central region 610 of the pixel array 205 with one or more different conductive paths 250.

The clock distribution network 310 may be configured to provide a global clock signal CLK to various components of the balanced signal distribution circuit 210. The clock distribution network 310 may comprise any suitable arrangement that delivers the clock signal CLK to the various components at substantially the same time. For example, in one embodiment, the clock distribution network 310 may comprise a fractal tree structure, such as an H-tree structure, constructed from perpendicular line segments having a repeating pattern that resembles the letter "H." In an alternative embodiment, the clock distribution network 310 may comprise a grid structure constructed of line segments that cross each other to form a series of squares or rectangles. The clock distribution network 310 may comprise metal wiring or any other suitable material for transmitting the clock signal CLK. The image sensor 200 may comprise a clock generator (not shown) configured to generate the clock signal CLK.

The signal control line 305 may be configured to transmit a control signal CTRL, such as a reset signal, a transfer signal, and/or a gain control signal. The signal control line 305 may comprise metal wiring or other material suitable for transmitting signals. In one embodiment, the signal control line 305 may be formed on the second die. In an alternative embodiment, the signal control line 305 may be formed on the same die as the pixel array 205 and interspersed with the pixels.

In an exemplary embodiment, the plurality of control circuits 220 are configured to transmit the control signal CTRL to the pixel array 205 substantially simultaneously. Each control circuit 220 may be configured to store and transmit data, and may be responsive to the clock signal CLK. In an exemplary embodiment, each control circuit 220 is electrically connected to the signal control line 305, the clock distribution network 310, and the pixel array 205. For example, an input terminal of each control circuit 220 is electrically connected to the signal control line 305 and configured to receive the control signal CTRL, and an output terminal of each control circuit 220 is electrically connected to the pixel array 205. Each control circuit 220 may be configured to control a particular row of pixels, a row segment, or a group of pixels situated on multiple rows. Each control circuit 220 may comprise any number of components suitable for facilitating the transmission of the control signal CTRL to the pixel array 205. For example, the control circuit 220 may comprise a logic circuit 300 and a driver circuit 320.

In various embodiments, the plurality of control circuits 220 may be distributed across a region defined by the pixel array 205, wherein the size of the region is substantially equal to the size of the pixel array 205. For example, and referring to FIG. 2, in a stacked arrangement, the plurality of control circuits 220 may be evenly distributed across a region on the second die 240 that is directly below the pixel array 205.

In a non-stacked arrangement, where both the balanced signal distribution circuit 210 and the pixel array 205 are integrated on a single die, the plurality of control circuits 220 may be evenly distributed and interspersed within the pixel array 205, wherein the size of the region occupied by the balanced signal distribution circuit 210 is substantially equal to the size of the pixel array 205. In other words, the balanced signal distribution circuit 210 (and/or plurality of control circuits 220) and the pixel array 205 are formed to occupy a common region on a single die. In various embodiments, the region may be centered with the pixel array 205.

In various embodiments, the particular arrangement of the plurality of control circuits 220 across the region defined by pixel array 205 may be selected according to design preferences. For example, in one embodiment, the plurality of control circuits 220 may be arranged in slices (i.e., rows) with spacing between adjacent slices. The spacing between adjacent slices may be utilized for other components and/or other functions. In an alternative embodiment, the plurality of control circuits 220 may be arranged directly below or interspersed within the pixel array according to a repeating pattern. In any case, the arrangement of the plurality of control circuits 220 is selected to ensure that the pixels in the outer region 600 receive the control signal CTRL substantially simultaneously as the pixels in the central region 610.

The logic circuit 300 may comprise any circuit suitable for operating as a memory element, such as a flip-flop circuit, a latch circuit, a gated latch circuit, and the like. For example, the logic circuit 300 may be coupled to the signal control line 305 and configured to receive the control signal CTRL. The logic circuit 300 may be coupled to the driver circuit 320. For example, an output terminal of the logic circuit 300 may be coupled to an input terminal of the driver circuit 320. The logic circuit 300 may be responsive to the clock signal CLK. For example, the logic circuit 300 may be configured to transmit the control signal CTRL to the driver circuits 320 according to the clock signal CLK.

The driver circuit 320 of may be configured to apply a gain to the control signal CTRL and subsequently transmit the control signal CTRL to the pixel array 205. The driver circuit 320 may comprise any suitable circuit for driving the control signal CTRL, for example the driver circuit 320 may comprise a single stage driver amplifier or any other suitable amplifier. An output terminal of the driver circuit 320 may be electrically connected to the pixel array 205. For example, the driver circuit 320 may transmit the control signal CTRL to one or more pixels in the pixel array 205 via the pixel control line 225.

Referring to FIG. 3, the balanced signal distribution circuit 210 may further comprise a switch 315 to selectively couple/decouple adjacent control circuits 220. For example, the switch 315 may comprise a conventional analog switch or a transistor and be positioned between two adjacent control circuits 220 that are coupled to different pixel control lines 225. In other words, the switch 315 may selectively couple/decouple a control circuit 220 from a first row to a control circuit 220 from a second row to short a pixel control line 225 or a segment of a pixel control line 225. The switch 315 may selectively couple/decouple the control circuits 220 from each other according to a switch control signal. For example, the control unit may be configured to generate and transmit the switch control signal to the switch 315.

In operation, the image sensor 200 is capable of substantially simultaneous charge integration. That is, all of the pixels in the pixel array 205 start and end charge integration at substantially the same time. For example, the pixels in the pixel array 205 may start charge integration within a few microseconds of each other, and similarly the pixels in the pixel array 205 may end charge integration within a few microseconds of each other. Accordingly, the image sensor 200 is capable of achieving short charge integration periods. According to an exemplary embodiment, the image sensor 200 operates in a global shutter mode (or global reset release mode), where all pixels, or a selected subset of pixels, in the pixel array 205 integrate at the same time, however, in other embodiments, the image sensor 200 may be operated in a rolling shutter mode.

Referring to FIGS. 2-5, the image sensor 200 may operate according to the clock signal CLK and various control signals CTRL. In an exemplary embodiment, the image sensor 200 may operate according to a reset signal (i.e., a first control signal) that resets the voltage potential of the pixel, and a transfer signal (i.e., a second control signal) that transfers the charge from the photosensor to some other storage region in the pixel. For example, the control unit may assert the reset signal and transmit the reset signal to the plurality of control circuits 220 via the signal control line 305. The plurality of control circuits 220 may receive the reset signal at different times due to the signal delay. Each control circuit 220 may then store/hold a value of the reset signal until a subsequent clock pulse. For example, the logic circuit 300 may store/hold the value of the reset signal until a rising edge of a subsequent clock pulse. The logic circuit 300 may be enabled at the rising edge of the clock pulse and may output the reset signal and transmit the reset signal to the driver circuit 320, wherein the driver circuit 320 drives the reset signal to the pixel array 205 through the electrically conductive paths 250 and the pixel control lines 225. Since the control circuits 220 are distributed over the region defined by the pixel array 205, the reset signal will reach each pixel in the pixel array 205 at substantially the same time. Once the reset signal has been de-asserted (typically after one clock period), the charge integration begins.

The control unit may then assert the transfer signal and transmit the transfer signal to the plurality of control circuits 220 via the signal control line 305. The plurality of control circuits 220 may receive the transfer signal at different times due to the signal delay. Each control circuit 220 may then store/hold a value of the transfer signal until a subsequent clock pulse. For example, the logic circuit 300 may store/hold the value of the reset transfer signal until a rising edge of a subsequent clock pulse. The logic circuit 300 may be enabled at the rising edge of the clock pulse and may output the transfer signal and transmit the transfer signal to the driver circuit 320, wherein the driver circuit 320 drives the transfer signal to the pixel array 205 through the electrically conductive paths 250 and the pixel control lines 225. Since the control circuits 220 are distributed over the region defined by the pixel array 205, the transfer signal will reach each pixel in the pixel array 205 at substantially the same time. Once the transfer signal has been de-asserted (typically after one clock period), charge integration ends. The time period between the start and end of charge integration is referred to as an integration period $T_{int}$. Accordingly, the integration period $T_{int}$ is substantially the same for all pixels in the pixel array 205. In a global shutter operation, where all pixels integrate at the same time, shortened integration periods may be achieved without the risk that the integration periods $T_{int}$ for some pixels, especially those pixels near the center of the pixel array 205, will not coincide with the integration periods $T_{int}$ of other pixels, such as those pixels near an outer edge of the pixel array 205.

In various embodiments, the particular control signals CTRL may be selected according to the pixel architecture, desired pixel operation, and the like. Further, the length of the integration period $T_{int}$ may be selected according to a particular application, desired operating mode, and the like.

According to an alternative operation, the balanced signal distribution circuit 210 may deliver the control signal CTRL to a region of interest within the pixel array 205. In other words, only a portion of the pixels in the pixel array 205 will be selected to receive the control signal CTRL. For example, in an automotive application, the region of interest may correspond to a particular object being tracked by the image sensor 200 and/or a host system (not shown). The balanced signal distribution circuit 210 will operate as described above such that the balanced signal distribution circuit 210 delivers the control signal CTRL to the pixels in the region of interest at substantially the same time.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An image sensor, comprising:
   a pixel array comprising:
     an outer region comprising a first pixel located in a first row of the pixel array and a second pixel located in a last row of the pixel array; and
     a central region comprising a third pixel located substantially at a geometric center of the pixel array; and
   a balanced signal distribution circuit:
     directly connected to the outer region with a first conductive path and a second conductive path; and
     directly connected to the central region with a third conductive path;
     wherein the balanced signal distribution circuit is configured to:
       deliver a control signal to:
         the first pixel using the first conductive path;
         the second pixel using the second conductive path; and
         the third pixel using the third conductive path, at substantially the same time.

2. The image sensor according to claim 1, wherein:
   the outer region comprises a first plurality of pixels, wherein the first plurality comprises the first and second pixels;
   the central region comprises a second plurality of pixels, wherein the second plurality comprises the third pixel; and
   the balanced signal distribution circuit delivers the control signal to the first and second plurality of pixels at substantially the same time.

3. The image sensor according to claim 1, wherein the balanced signal distribution circuit is further configured to deliver the control signal to a plurality of pixels within a region of interest within the pixel array at substantially the same time.

4. The image sensor according to claim 1, wherein the balanced signal distribution circuit comprises a balanced tree network configured to transmit at least one of the control signal and a clock signal.

5. The image sensor according to claim 1, wherein:
   the balanced signal distribution circuit comprises a clock distribution network configured to transmit a clock signal; and
   the clock distribution network comprises one of: a tree structure and a grid structure.

6. The image sensor according to claim 5, wherein the balanced signal distribution circuit further comprises a plurality of logic circuits, wherein the plurality of logic circuits are:
   coupled to the clock distribution network; and
   responsive to the clock signal.

7. The image sensor according to claim 6, wherein the balanced signal distribution circuit further comprises a plurality of driver circuits, wherein each driver circuit of the plurality of driver circuits is coupled between one logic circuit of the plurality of logic circuits and the pixel array.

8. The image sensor according to claim 7, further comprising a switch positioned between output terminals of adjacent driver circuits.

9. The image sensor according to claim 1, wherein:
   the pixel array and the balanced signal distribution circuit occupy a common region on a monolithic die;
   the pixel array is evenly distributed across the common region; and
   the balanced signal distribution circuit is evenly distributed across the common region.

10. The image sensor according to claim 1, wherein:
    the pixel array is formed on a first die;
    the balanced signal distribution circuit is formed on a second die;
    the first and second dies are coupled to form a 3D vertical stack; and
    the balanced signal distribution circuit and the pixel array are aligned vertically.

11. The image sensor according to claim 10, wherein the balanced signal distribution circuit is coupled to the pixel array via hybrid bonds.

12. A method for forming an image sensor capable of balanced signal distribution, comprising:
    forming a pixel array comprising an outer region and a central region, wherein the outer region comprises a first pixel located in a first row of the pixel array and a second pixel located in a last row of the pixel array; and the central region comprises a third pixel located substantially at a geometric center of the pixel array; and
    forming a balanced signal distribution circuit capable of:
      transmitting a control signal across a signal control line to a plurality of control circuits;

wherein each control circuit stores the control signal;
transmitting a clock signal across a clock distribution network to the plurality of control circuits; and
supplying, with the plurality of control circuits, the control signal to the pixels located in the outer region and the central region substantially simultaneously.

13. The method according to claim 12, wherein:
the pixel array occupies a first region having a first predetermined area on a first die;
the plurality of control circuits occupy a second region having a second predetermined area on a second die that is equal to the first predetermined area;
the plurality of control circuits are distributed evenly across the second region;
the first and second dies are coupled to form a 3D vertical stack using hybrid bonding; and
the first and second regions are aligned vertically.

14. The method according to claim 12, wherein the plurality of control circuits and the pixel array are formed to occupy a common region on a single die.

15. The method according to claim 12, wherein the clock distribution network comprises one of a balanced tree structure and a grid structure.

16. The method according to claim 12, wherein each control circuit of the plurality of control circuits comprises:
a logic circuit responsive to the clock signal; and
a driver circuit coupled between an output terminal of the logic circuit and the pixel array.

17. An image sensor, comprising:
a pixel array comprising an outer region and a central region, wherein the outer region comprises a first pixel located in a first row of the pixel array and a second pixel located in a last row of the pixel array; and the central region comprises a third pixel located substantially at a geometric center of the pixel array; and
a balanced signal distribution circuit connected to the pixel array and comprising:
a plurality of control circuits, each control circuit comprising a logic circuit; and
a balanced network coupling the plurality of control circuits to each other and configured to transmit at least one of:
a control signal to each logic circuit; and
a clock signal to each logic circuit;
wherein:
the plurality of control circuits are configured to transmit the control signals to the pixel array according to the clock signal; and
the pixels located in the outer region and the central region receive the plurality of control signals substantially simultaneously.

18. The image sensor according to claim 17, wherein:
the balanced network comprises one of: an H-tree structure and a grid structure; and
a time delay between the pixels in the outer region receiving the plurality of control signals and the pixels in the central region receiving the plurality of control signals is less than 100 nanoseconds.

19. The image sensor according to claim 17, wherein:
the pixel array is formed within a first region having a first predetermined area on a first die;
the plurality of control circuits are distributed across a second region having a second predetermined area on a second die that is equal to the first predetermined area;
the first and second dies are coupled to form a 3D vertical stack; and
the first and second regions are aligned vertically.

20. The image sensor according to claim 17, wherein:
the pixel array and the balanced signal distribution circuit occupy a common region on a monolithic die;
the pixel array and the balanced signal distribution circuit are evenly distributed across the common region; and
the pixel array and the balanced signal distribution circuit have substantially equal areas.

* * * * *